United States Patent
Takiguchi et al.

(10) Patent No.: US 7,720,123 B2
(45) Date of Patent: May 18, 2010

(54) BURIED TYPE SEMICONDUCTOR LASER

(75) Inventors: Tohru Takiguchi, Tokyo (JP); Chikara Watatani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/611,933

(22) Filed: Dec. 18, 2006

(65) Prior Publication Data

US 2008/0049805 A1    Feb. 28, 2008

(30) Foreign Application Priority Data

Aug. 28, 2006    (JP) ............................. 2006-231125

(51) Int. Cl.
    *H01S 5/00* (2006.01)
(52) U.S. Cl. ................................... 372/46.01
(58) Field of Classification Search ............ None
    See application file for complete search history.

(56) References Cited

U.S. PATENT DOCUMENTS

| | | | |
|---|---|---|---|
| 4,692,206 A * | 9/1987 | Kaneiwa et al. | 372/45.01 |
| 5,452,315 A * | 9/1995 | Kimura et al. | 372/46.01 |
| 5,636,237 A * | 6/1997 | Terakado et al. | 372/46.014 |
| 5,692,002 A * | 11/1997 | Mizutani | 372/46.01 |
| 5,717,710 A * | 2/1998 | Miyazaki et al. | 372/50.11 |
| 6,323,507 B1 * | 11/2001 | Yokoyama et al. | 372/46.01 |
| 6,664,605 B1 | 12/2003 | Akulova et al. | |
| 6,717,187 B2 * | 4/2004 | Kondo et al. | 372/46.01 |

FOREIGN PATENT DOCUMENTS

| | | | |
|---|---|---|---|
| JP | 01209771 A | * | 8/1989 |
| JP | 04-320083 | | 11/1992 |
| JP | 05-037084 A | | 2/1993 |
| JP | 06-334259 A | | 12/1994 |
| JP | 11-266051 A | | 9/1999 |
| JP | 2001-352131 A | | 12/2001 |

OTHER PUBLICATIONS

"High-Performance Uncooled 1.3 μm AlxGayIn1-x-yAs/InP Strained-Layer Quantum-Well Lasers for Subscriber Loop Applications," by Zah et al., IEEE Journal of Quantum Electronics, vol. 30, Feb. 1994, pp. 511-521.*
D. Kim, et al., "Fe-doped InP semi-insulating buried heterostructure for high speed and high power operations in directly modulated semiconductor laser", *Electronics Letters*, 40 (15), Jul. 22, 2004.

* cited by examiner

*Primary Examiner*—Minsun Harvey
*Assistant Examiner*—Sean Hagan
(74) *Attorney, Agent, or Firm*—Leydig, Voit & Mayer, Ltd.

(57) ABSTRACT

A buried type semiconductor laser 1 is made of a p-type InP substrate 2 and includes a ridge section 6 made up of a p type InP first clad layer 3, AlGaInAs distorted quantum well active layer 4 and n type InP second clad layer 5 laminated one atop another. On both sides of the ridge section 6, an buried current block layer 10 made up of a p-type InP first buried layer 7, n-type InP second buried layer 8 and semi-insulating Fe-doped InP third buried layer 9 laminated one atop another is formed. A top face of the third buried layer 9 is covered with an n-type InP semiconductor layer 11. The above structure can suppress the occurrence of a leakage current path on the top face of the third buried layer 9 and improve reliability of the buried type semiconductor laser.

4 Claims, 12 Drawing Sheets

BURIED TYPE SEMICONDUCTOR LASER

BACKGROUND OF THE INVENTION

1. Field of the Invention

The present invention relates to a buried type semiconductor laser, and more particularly, to a buried type semiconductor laser having a mesa stripe structure with reduced leakage current.

2. Background Art

With the expansion of an optical fiber communication network, there is a growing demand for a semiconductor laser capable of high-speed, high-temperature operation in recent years. As such a semiconductor laser, a buried type semiconductor laser having such a structure that a mesa stripe-shaped light guide is formed on a semiconductor substrate and current block layers are buried on both sides thereof is being widely used (for example, see Japanese Patent Laid-Open No. 4-320083).

Figure 17:
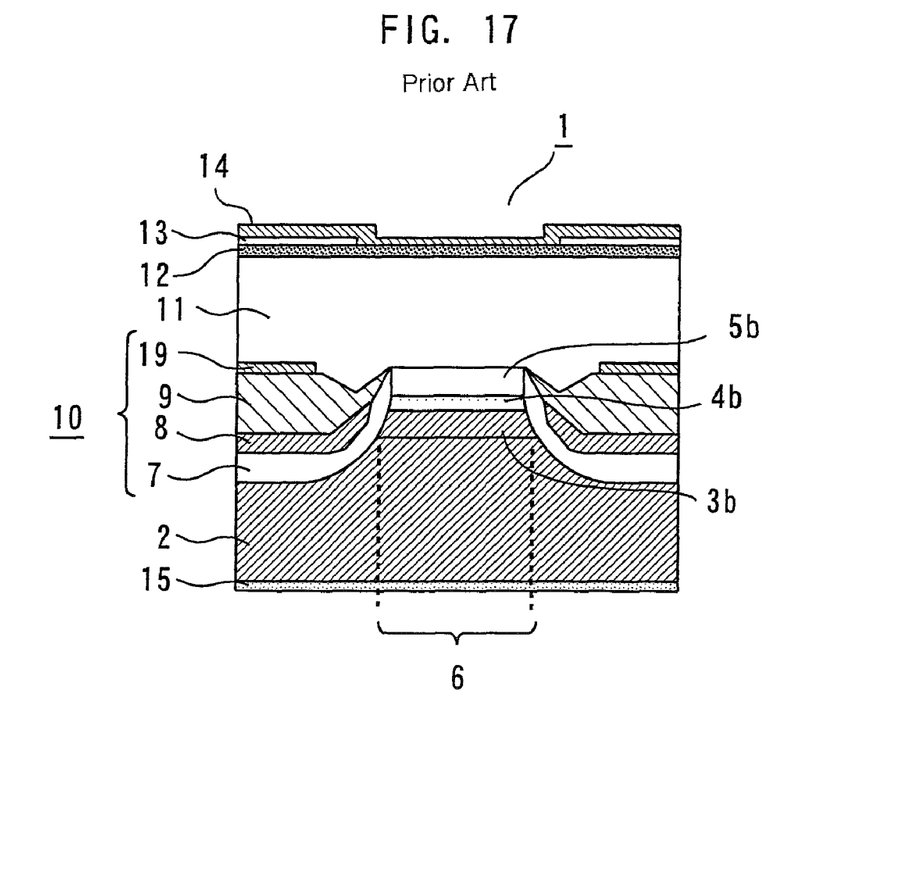
FIG. 17 shows a cross-sectional structure of the above described conventional buried type semiconductor laser.

FIG. 17 shows a cross-sectional structure of the above described conventional buried type semiconductor laser. This semiconductor laser 1 is made of an n-type InP substrate 2. On the InP substrate 2, an n-type InP clad layer 3b, an AlGaInAs distorted quantum well active layer 4b and a p-type InP clad layer 5b are formed like a mesa and a ridge section 6 is made up of these layers. A p-type InP buried layer 7, an n-type InP buried layer 8 and an buried layer 9 made of semi-insulating Fe-doped InP are buried on both sides of the ridge section 6, and an n-type InP buried layer 19 is further formed thereon. A current block layer 10 is made up of these layers.

A p-type InP layer 11 and a p-type InGaAs contact layer 12 are provided on the p-type InP clad layer 5b and n-type InP buried layer 19. An $SiO_2$ film pattern 13 and a p-type electrode 14 are further formed thereon. An n-type electrode 15 is provided on the back of the InP substrate 2.

Next, the method of manufacturing the semiconductor laser shown in FIG. 17 will be explained. First, as shown in FIG. 18, crystals of an n-type InP layer 3c, an AlGaInAs distorted quantum well active layer 4c and a p-type InP layer 5c are made to grow one by one on the n-type InP substrate 2 using an metal organic chemical vapor deposition (MOCVD method).

Figure 18:
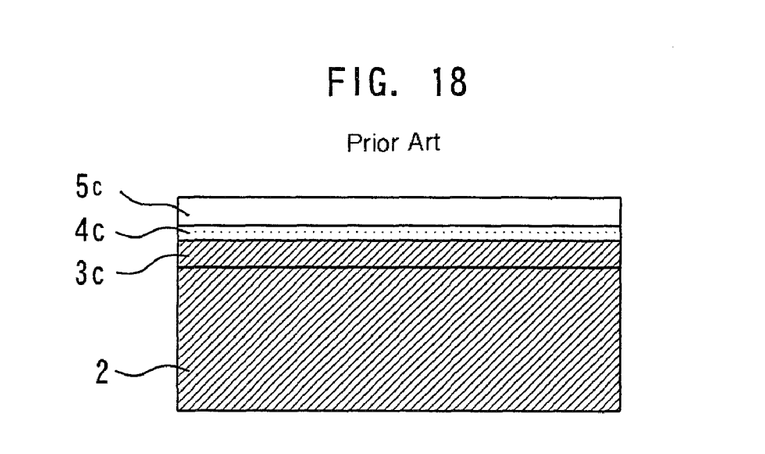
FIGS. 18-23 are sectional views for explaining a method of manufacturing a conventional buried type semiconductor laser.

Next, an $SiO_2$ film (silicon oxide film) is formed on the p-type InP layer 5c shown in FIG. 18 and patterned. As a result, an $SiO_2$ film pattern 16 is formed on the p-type InP layer 5c as shown in FIG. 19.

Figure 19:
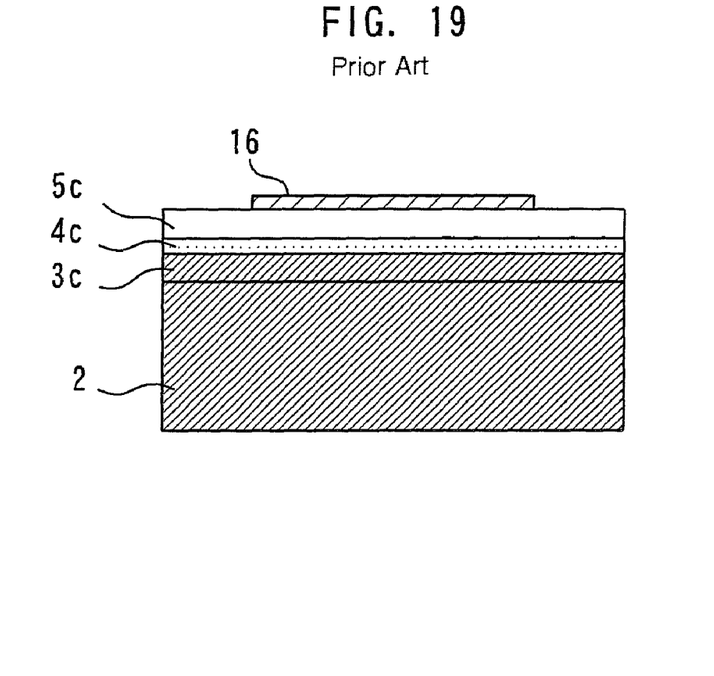

Next, the p-type InP layer 5c, AlGaInAs distorted quantum well active layer 4c, n-type InP layer 3c and n-type InP substrate 2 are wet etched using the $SiO_2$ film pattern 16 shown in FIG. 19 as a mask. As a result, the ridge section 6 consisting of the n-type InP layer 3b, AlGaInAs distorted quantum well active layer 4b and p-type InP layer 5b is formed as shown in FIG. 20.

Figure 20:
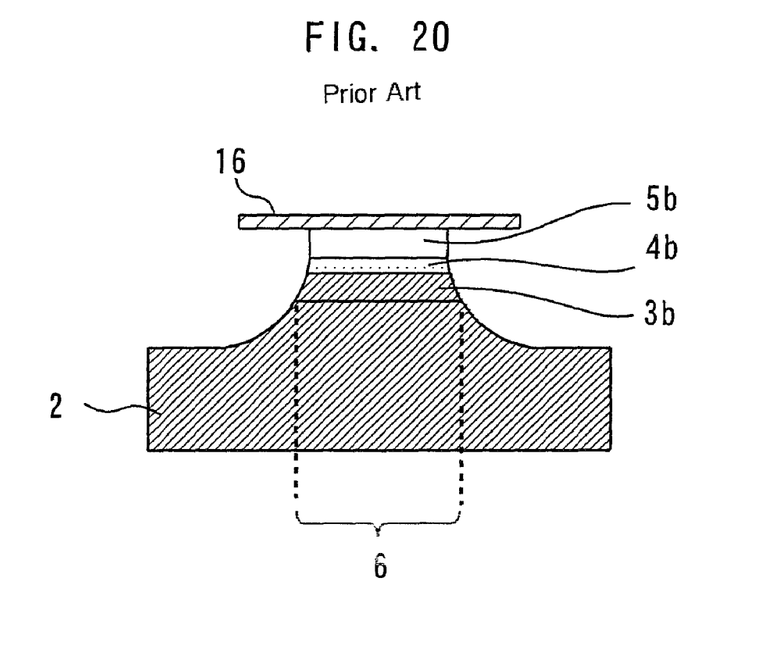

Next, the p-type InP buried layer 7, n-type InP buried layer 8, semi-insulating Fe-doped InP buried layer 9 and n-type InP buried layer 19 are formed one by one on both sides of the ridge section 6 shown in FIG. 20 using the MOCVD method. As a result, the buried current block layer 10 is formed as shown in FIG. 21.

Figure 21:
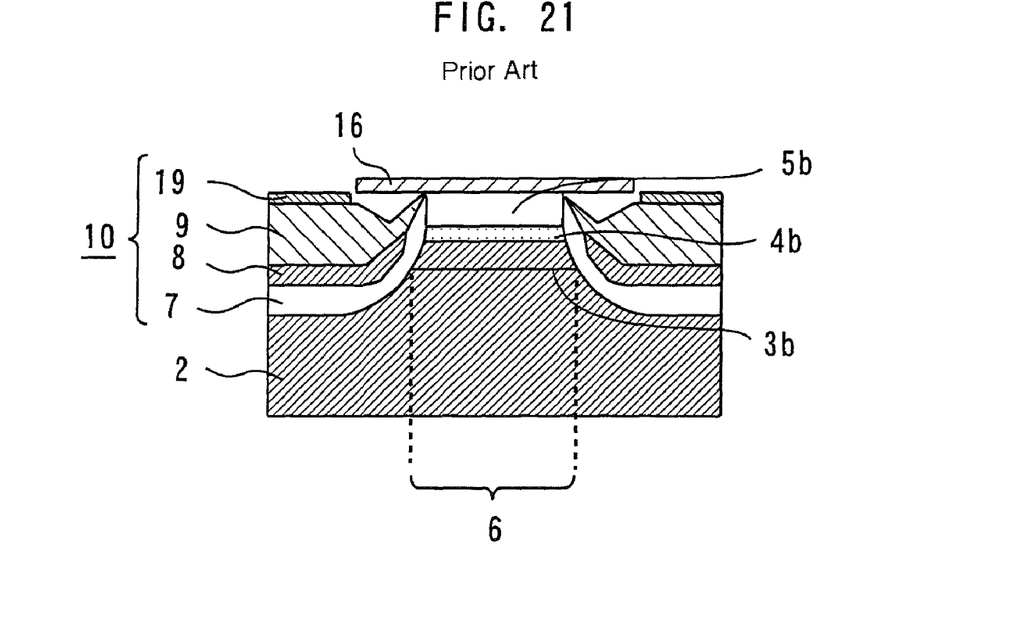
Figure 22:
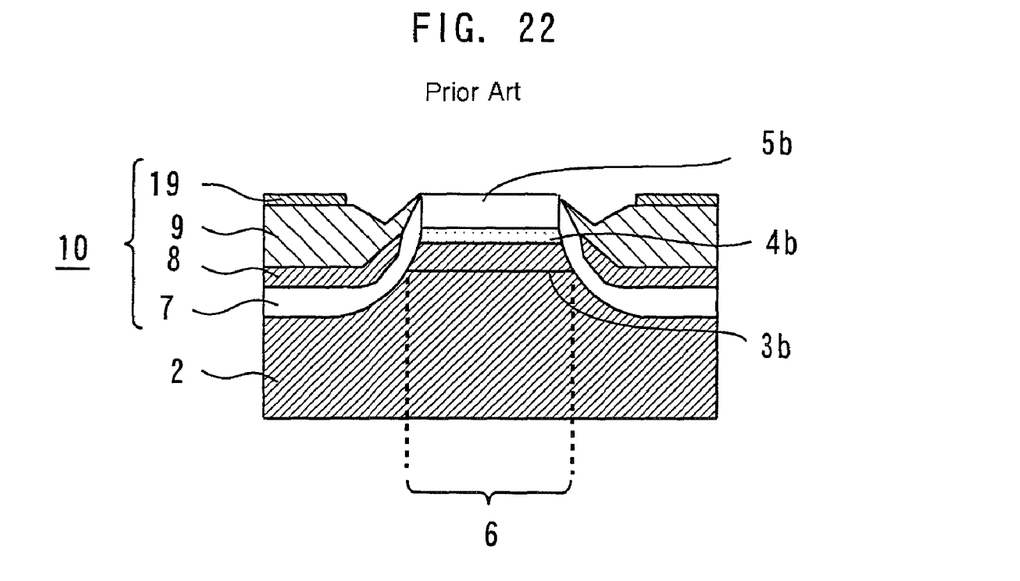

Next, the $SiO_2$ film pattern 16 shown in FIG. 21 is removed by etching. As a result, the structure shown in FIG. 22 is obtained. Next, as shown in FIG. 23, the p-type InP layer 11 and the p-type InP contact layer 12 are formed on then-type InP buried layer 19 and p-type InP layer 5b using the MOCVD method.

Figure 23:
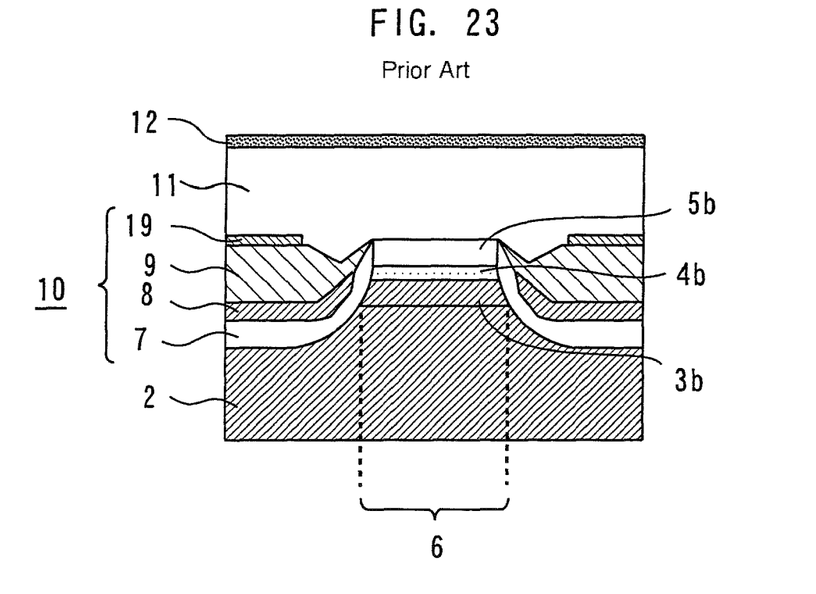

Next, the $SiO_2$ film pattern 13 is formed on the p-type InP contact layer 12 shown in FIG. 23 and the p-type electrode 14 is formed thereon. Furthermore, the n-type electrode 15 is formed on the back of the InP substrate 2. As a result, the semiconductor laser shown in FIG. 17 can be obtained.

In the structure of the semiconductor laser shown in FIG. 17, the semi-insulating Fe-doped InP buried layer 9 blocks a current by trapping electrons. For this purpose, the top face and bottom face of the semi-insulating Fe-doped InP buried layer 9 need to be covered with the n-type InP layer.

However, in the process of forming the p-type InP buried layer 7, n-type InP buried layer 8, semi-insulating Fe-doped InP buried layer 9 and n-type InP buried layer 19 shown in FIG. 21, an MO (metal organic) gas hardly wraps around into the back side at both ends of the $SiO_2$ film pattern 16.

Figure 24:
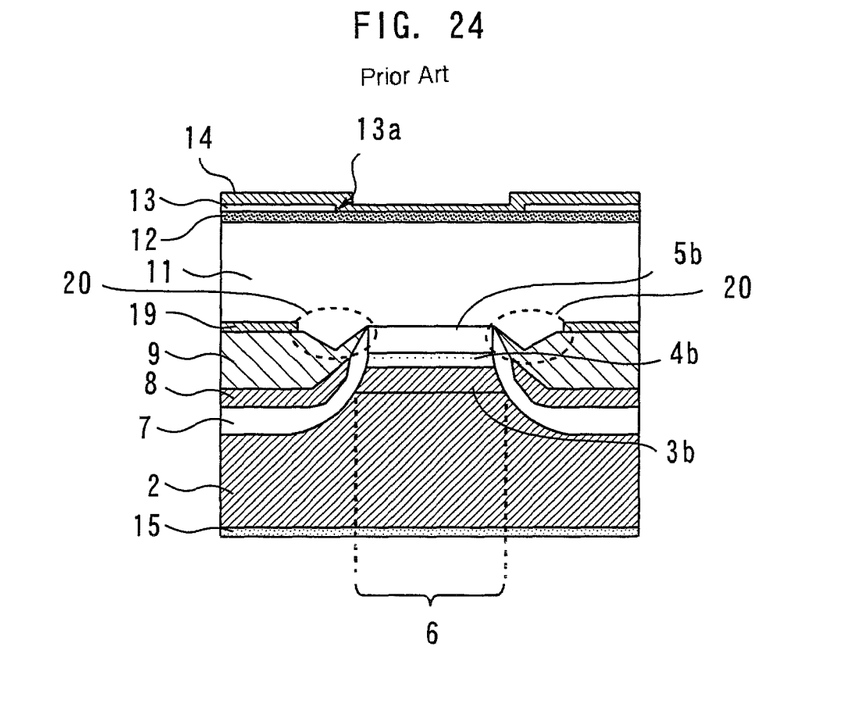
FIG. 24 shows a path through which a leakage current flows.

Therefore, as shown in FIG. 24, at the top ends (the parts surrounded by dotted lines 20) on both sides of the ridge section 6, the top face of the semi-insulating Fe-doped InP buried layer 9 contacts the p-type InP layer 11. Therefore, the above described contact parts become a path through which a leakage current flows. That is, the above described conventional buried type semiconductor laser has a problem that the current-light output characteristic of the laser deteriorates due to the above described leakage current.

SUMMARY OF THE INVENTION

The present invention has been implemented to solve the above described problem and it is an object of the present invention to provide a buried type semiconductor laser which improves a current-light output characteristic by restraining a leakage current.

According to one aspect of the present invention, a buried type semiconductor laser has a p-type semiconductor substrate; a first clad layer made of p-type semiconductor provided on the semiconductor substrate in a predetermined width; an active layer provided on the first clad layer for generating laser light; a second clad layer made of n-type semiconductor provided on the active layer, a ridge section made up of the first clad layer, the active layer and the second clad layer; a first buried layer made of p-type semiconductor which contacts a side of the ridge section; a second buried layer made of n-type semiconductor which contacts a side and top face of the first buried layer; a semi-insulating third buried layer containing Fe which contacts a side and top face of the second buried layer; and an n-type semiconductor layer which covers a top face of the second clad layer and a top face of the third buried layer.

According to the present invention, it is possible to obtain a buried type semiconductor laser with an improved current-light output characteristic by restraining a leakage current.

Other and further objects, features and advantages of the invention will appear more fully from the following description.

DETAILED DESCRIPTION OF THE PREFERRED EMBODIMENTS

With reference now to the attached drawings, embodiments of the present invention will be explained in detail below. In the respective drawings, identical or equivalent parts are assigned identical reference numerals and explanations thereof will be simplified or omitted.

First Embodiment

Figure 1:
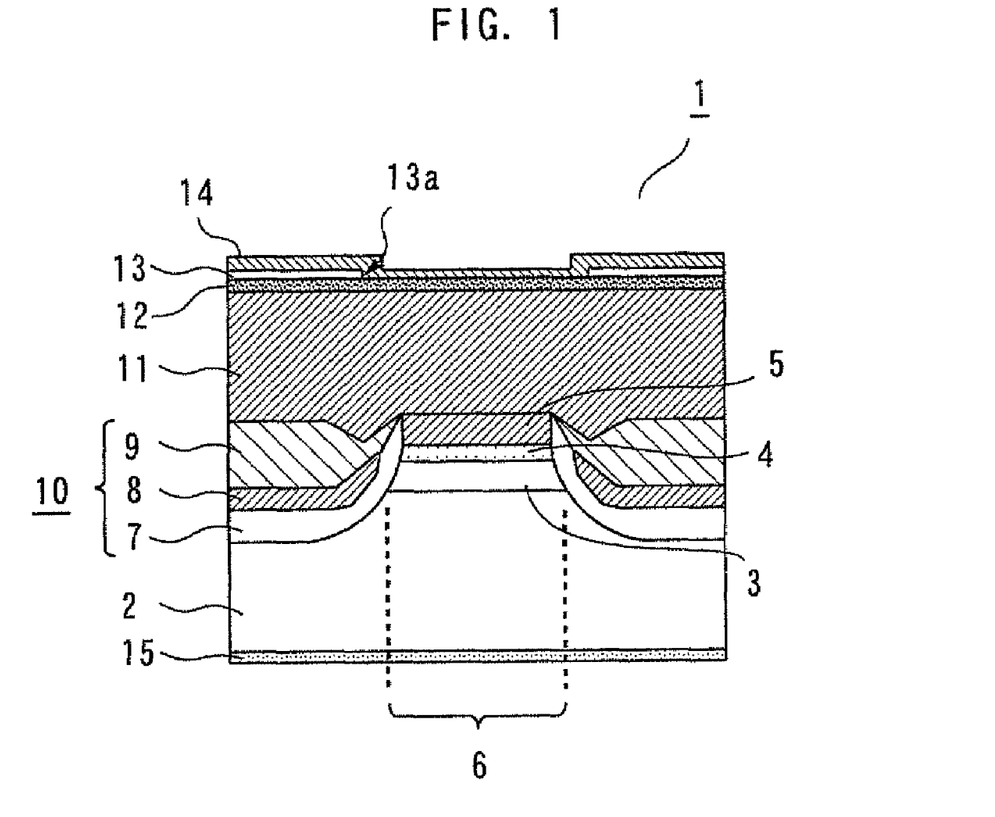
FIG. 1 shows a cross-sectional structure of a buried type semiconductor laser according to First Embodiment of the present invention.

A buried type semiconductor laser according to this First Embodiment will be explained. As shown in FIG. 1, a buried type semiconductor laser 1 is made of a p-type InP substrate (hereinafter, simply referred to as a "substrate") 2.

A p-type InP first clad layer 3 (carrier concentration $p=1\times 10^{18}$ cm$^{-3}$) having a fixed width is provided on the substrate 2. An AlGaInAs distorted quantum well active layer (hereinafter, simply referred to as an "active layer") 4 which generates laser light is provided on the first clad layer 3. An n-type InP second clad layer 5 (carrier concentration $n=1\times 10^{18}$ cm$^{-3}$) is provided on the active layer 4. A ridge section 6 is made up of the first clad layer 3, active layer 4 and second clad layer 5.

A p-type InP first buried layer 7 (carrier concentration $p=1\times 10^{18}$ cm$^{-3}$) is provided so as to contact a side of the ridge section 6. An n-type InP second buried layer 8 (carrier concentration $n=1\times 10^{19}$ cm$^{-3}$) is provided so as to contact a side and top face of the first buried layer 7. A third buried layer 9 made of semi-insulating Fe-doped InP (carrier concentration $Fe=4\times 10^{16}$ cm$^{-3}$) is provided so as to contact a side and top face of the second buried layer 8. An end of the third buried layer 9 is provided so as to contact an end of the first buried layer 7.

An buried current block layer 10 is made up of the above described first buried layer 7, second buried layer 8 and third buried layer 9.

An n-type InP semiconductor layer 11 (carrier concentration $n=1\times 10^{18}$ cm$^{-3}$) is provided on the entire surface of the top face of the second clad layer 5 and the top face of the third buried layer 9. In other words, the whole surface of the third buried layer 9 is covered with the n-type semiconductor layer 11.

An n-type InP contact layer 12 (carrier concentration $n=1\times 10^{19}$ cm$^{-3}$) is provided on the semiconductor layer 11. An SiO$_2$ film pattern 13 is provided on the contact layer 12. An opening 13a is provided in the SiO$_2$ film pattern 13. An n-type electrode 14 made up of Ti, Pt and Au layers laminated one atop another is provided so as to fill this opening 13a. Furthermore, a p-type electrode 15 made up of Ti, Pt and Au layers laminated one atop another is provided on the back of the substrate 2.

Here, the buried type semiconductor laser 1 shown in FIG. 1 is made of a p-type InP substrate. Therefore, the first clad layer 3, that is, a p-type semiconductor layer is provided on the bottom face of the active layer 4. The second clad layer 5, that is, an n-type semiconductor layer is provided on the top face of the active layer 4. Moreover, the n-type semiconductor layer 11 is provided on the second clad layer 5.

By adopting the structure in FIG. 1, the entire top face of the third buried layer 9 is covered with the n-type semiconductor layer 11. Therefore, according to the structure in FIG. 1, there is no path through which the leakage current shown in the conventional technology (see FIG. 24) flows. Therefore, the current-light output characteristic of the laser can be improved compared with the conventional technology.

In the structure shown in FIG. 1, p-type InP is used as the first buried layer 7. Since the energy level of the conduction band is high, this layer has an effect of restraining electrons from overflowing from the active layer 4. This makes it possible to improve the current-light output characteristic of the semiconductor laser at a high temperature in particular.

Next, the method of manufacturing the buried type semiconductor laser shown in FIG. 1 will be explained. First, as shown in FIG. 2, a p-type InP layer 3a, an AlGaInAs layer 4a and an n-type InP layer 5a are laminated one atop another on the substrate 2 using an metal organic chemical vapor deposition (hereinafter, referred to as an "MOCVD method").

Figure 2:
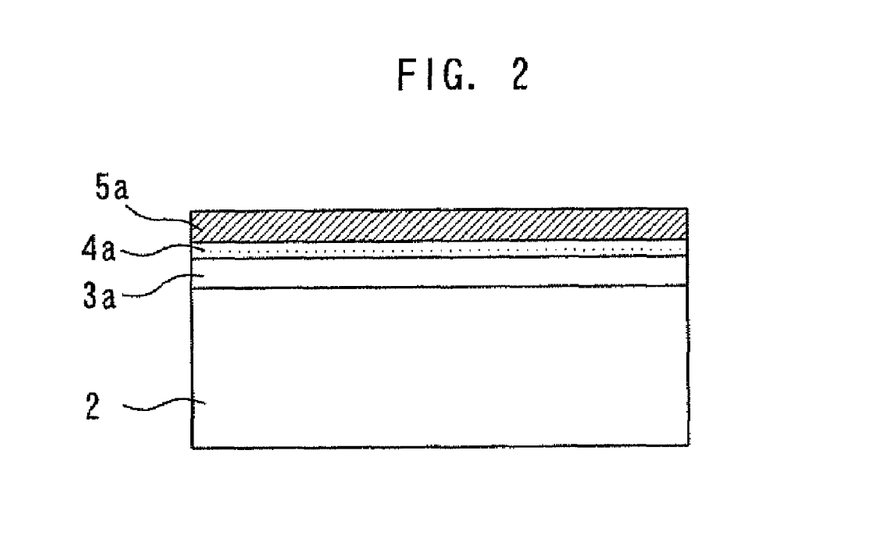
FIGS. 2-8 are sectional views for explaining a method of manufacturing a buried type semiconductor laser according to First Embodiment of the present invention.

Next, an SiO$_2$ film is formed on the InP layer 5a shown in FIG. 2. Next, the SiO$_2$ film is patterned using lithography and etching or the like. As a result, as shown in FIG. 3, an SiO$_2$ film pattern 16 is formed on the InP layer 5a.

Figure 3:
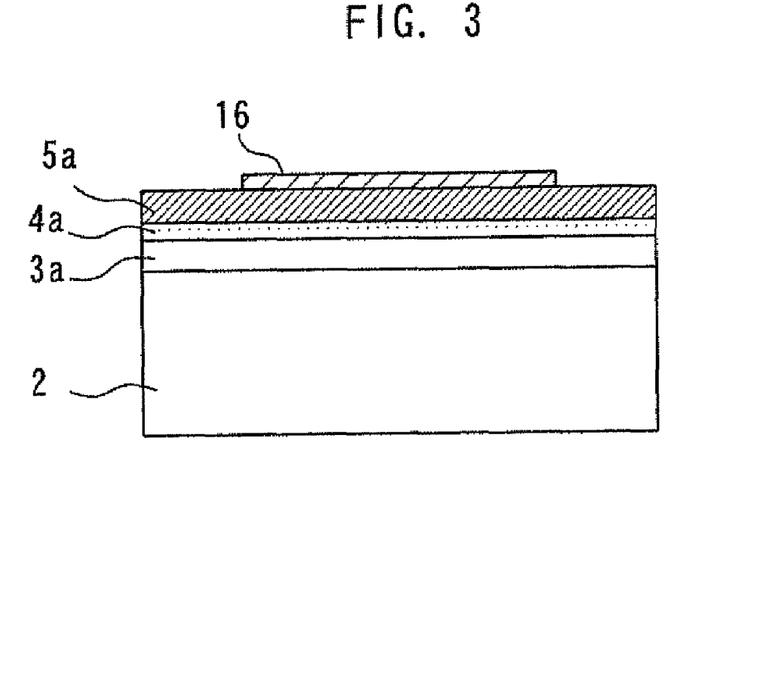

Next, the InP layer 5a, AlGaInAs layer 4a, InP layer 3a and substrate 2 are wet etched using the SiO$_2$ film pattern 16 shown in FIG. 3 as a mask. As a result, as shown in FIG. 4, the ridge section 6 made up of the first clad layer 3, active layer 4 and second clad layer 5 is formed on the substrate 2.

Figure 4:
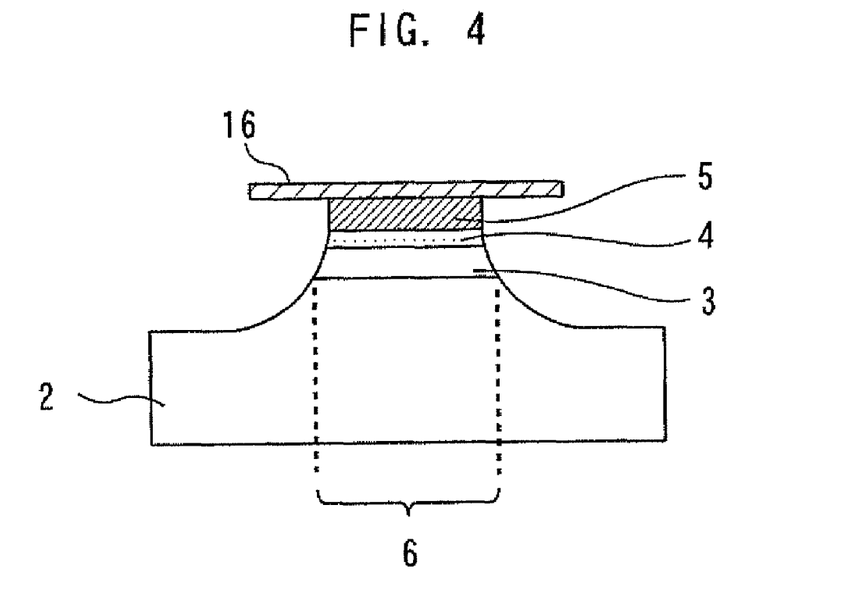

Next, the first buried layer 7, second buried layer 8 and third buried layer 9 are formed one by one on both sides of the ridge section 6 shown in FIG. 4 using the MOCVD method. As a result, as shown in FIG. 5, the buried current block layer 10 in which the first buried layer 7, second buried layer 8 and third buried layer 9 are laminated together is formed.

Figure 5:
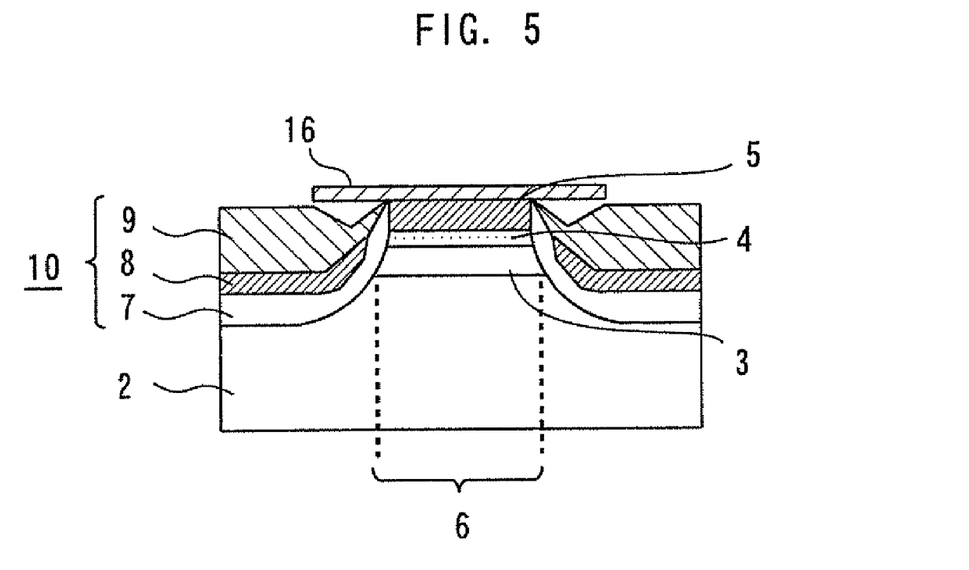
Figure 6:
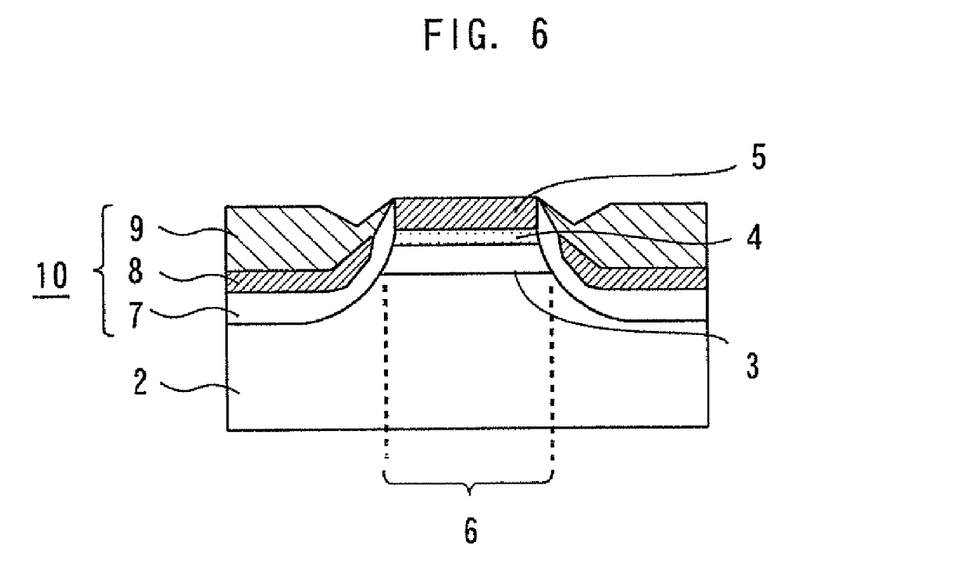

Next, the shape shown in FIG. 6 is obtained by removing the SiO$_2$ film pattern 16 shown in FIG. 5 through etching. Next, the n-type InP semiconductor layer 11 is formed on the entire surfaces of the second clad layer 5 and third buried layer 9 shown in FIG. 6. The n-type InP contact layer 12 is further formed thereon. As a result, the shape shown in FIG. 7 is obtained.

Figure 7:
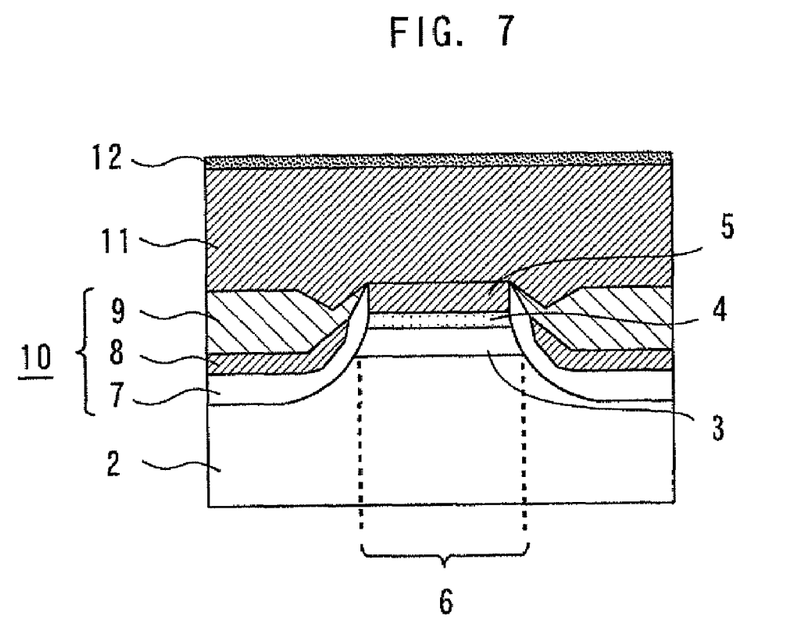
Figure 8:
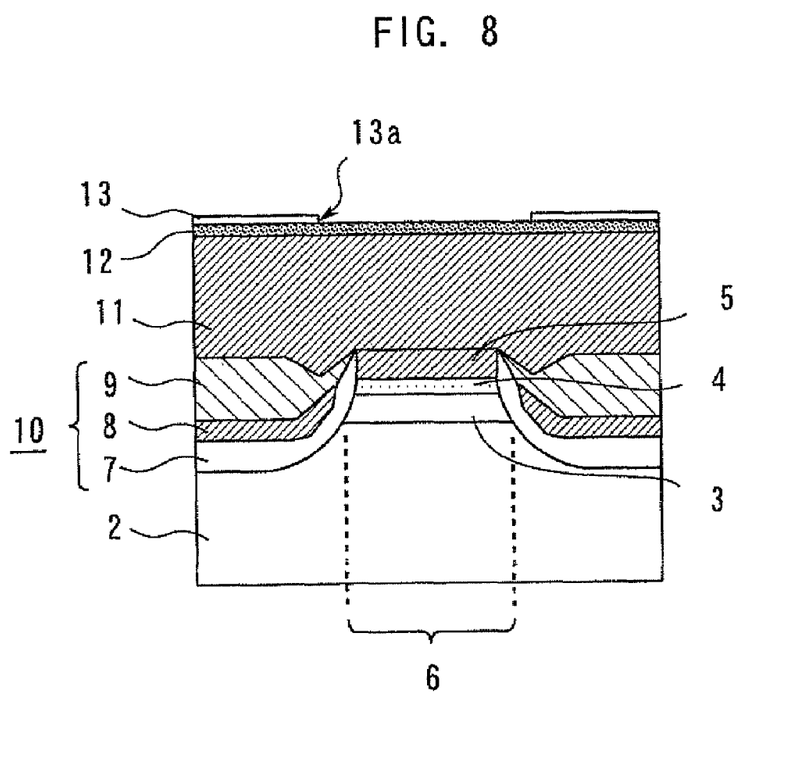

Next, an SiO$_2$ film (silicon oxide film) is formed on the entire surface of the contact layer 12 shown in FIG. 7 and then patterned using lithography and etching. As a result, as shown in FIG. 8, the SiO$_2$ film pattern 13 is formed on the contact layer 12. At this time, the opening 13a is formed above the ridge section 6.

Next, Ti, Pt and Au layers are laminated one atop another so as to fill the opening 13a shown in FIG. 8 to form the n-type electrode 14 which contacts the contact layer 12. Moreover, Ti, Pt and Au layers are also laminated one atop another on the back of the substrate 2 to form the p-type electrode 15. As a result, the buried type semiconductor laser 1 shown in FIG. 1 can be formed.

Second Embodiment

A buried type semiconductor laser according to this Second Embodiment will be explained. Here, explanations will be focused on differences from First Embodiment.

Figure 9:
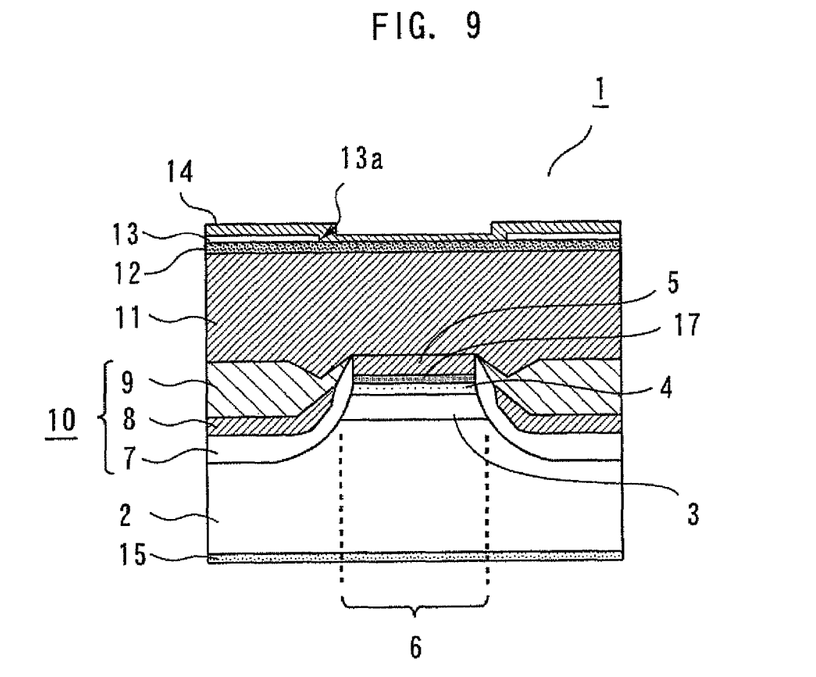
FIG. 9 shows a cross-sectional structure of a buried type semiconductor laser according to Second Embodiment of the present invention.

As shown in FIG. 9, an n-type InGaAsP diffraction grating 17 (carrier concentration $n=1\times10^{18}$ cm$^{-3}$) is provided between an active layer 4 and a second clad layer 5. The diffraction grating 17 is provided at predetermined intervals along the direction in which laser light travels and can reflect laser light of a specific wavelength. The provision of the diffraction grating 17 allows laser light in a single oscillation mode to be obtained.

Here, when p-type semiconductor is used as the diffraction grating, it is known that holes are piled up in the diffraction grating. On the other hand, since the structure shown in FIG. 9 uses n-type semiconductor as the diffraction grating, the deterioration of the current-light output characteristic can be restrained. Other aspects are the same as those in the structure shown with First Embodiment.

Furthermore, when the diffraction grating 17 is provided between the active layer 4 and first clad layer 3, a crystal of the active layer is made to grow on the diffraction grating having an uneven surface and crystal flaws are likely to be produced in the active layer. On the other hand, in the structure shown in FIG. 9, the diffraction grating 17 is provided between the active layer 4 and second clad layer 5. This restrains crystal flaws from being produced in the active layer and allows a semiconductor laser with high reliability to be obtained.

In addition to the effect of First Embodiment, the buried type semiconductor laser according to this Second Embodiment allows a semiconductor laser with high reliability to be obtained.

Third Embodiment

A buried type semiconductor laser according to this Third Embodiment will be explained. Here, explanations will be focused on differences from First Embodiment.

Figure 10:
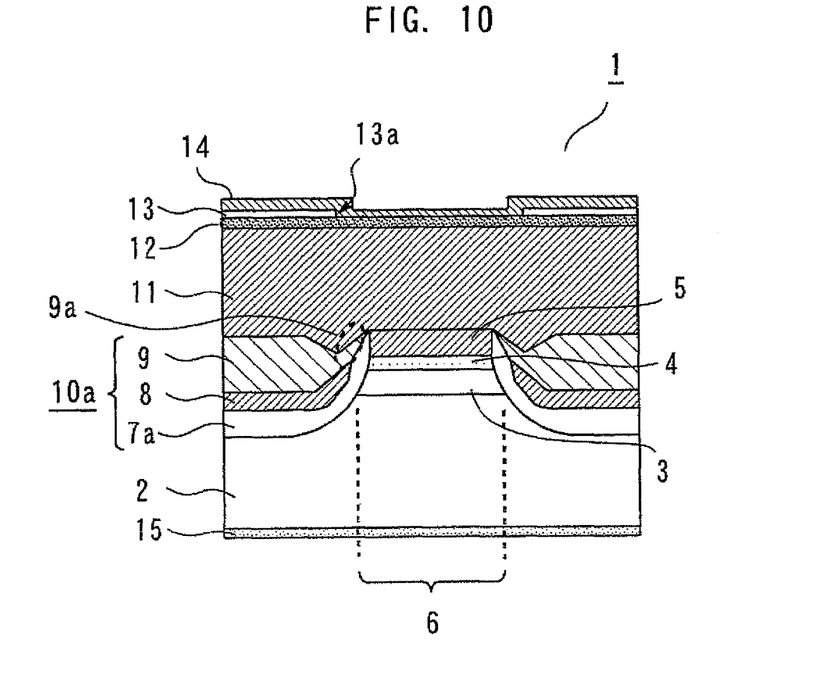
FIG. 10 shows a cross-sectional structure of a buried type semiconductor laser according to Third Embodiment of the present invention.

As shown in FIG. 10, an InP buried layer doped with both a p-type dopant and Fe dopant (carrier concentration $p=1\times10^{18}$ cm$^{-3}$, carrier concentration Fe$=4\times10^{16}$ cm$^{-3}$) is provided as a first buried layer 7a. That is, the buried type semiconductor laser in FIG. 10 is made to contain Fe in the first buried layer. Other aspects are the same as those in First Embodiment.

In the case of the structure shown in First Embodiment, the end of the first buried layer 7 and the end of the third buried layer 9 contact each other as shown in FIG. 1. Furthermore, the first buried layer 7 contains a p-type dopant such as Zn (zinc) and the third buried layer contains Fe (iron). In this case, it is known that the p-type dopant such as Zn and Fe are liable to mutual diffusion.

More specifically, most of the Fe dopant drains out into the first buried layer 7 in the vicinity of an interface between the third buried layer 9 and first buried layer 7, that is, an end 9a of the third buried layer 9. On the contrary, a p-type dopant such as Zn is diffused from the first buried layer 7 to the end 9a of the third buried layer 9. In this way, in the structure shown in First Embodiment, mutual diffusion occurs in the vicinity of the interface between the first buried layer 7 and third buried layer 9. Therefore, in the structures of Embodiments 1 and 2, since the current block effect of the buried current block layer 10 reduces and the leakage current which passes through the above described interface increases, and therefore the current-light output characteristic deteriorates.

On the other hand, in this Third Embodiment, the first buried layer 7a is doped with the Fe dopant beforehand or Fe doping is applied after the first buried layer 7a is formed. This allows the above described mutual diffusion to be suppressed. Therefore, the current-light output characteristic can be further improved compared to First Embodiment.

Though not shown, it is also possible to adopt a structure in which a diffraction grating made of n-type semiconductor such as n-type InGaAsP is provided between the active layer 4 and second clad layer 5 in FIG. 10. Such a structure can obtain effects similar to those in Second Embodiment in addition to the above described effects.

Fourth Embodiment

A buried type semiconductor laser according to this Fourth Embodiment will be explained. Here, explanations will be focused on differences from First Embodiment.

Figure 11:
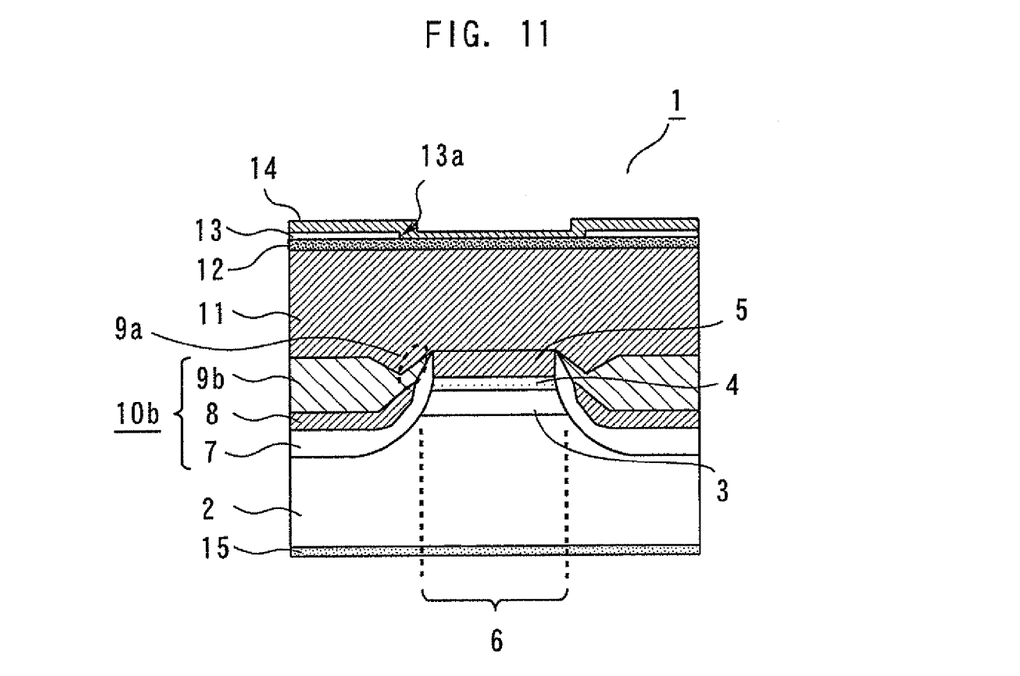
FIG. 11 shows a cross-sectional structure of a buried type semiconductor laser according to Fourth Embodiment of the present invention.

As shown in FIG. 11, semi-insulating Ru-doped InP is used as a third buried layer 9b. That is, Fe contained in the third buried layer 9 shown in First Embodiment is substituted by Ru (ruthenium). Other aspects are the same as those in First Embodiment.

Here, it is known that Ru is substantially not liable to mutual diffusion with a p-type dopant such as Zn included in a first buried layer 7. Therefore, a semiconductor laser with an improved current-light output characteristic as in the case of Third Embodiment can be obtained.

Furthermore, a second buried layer 8 is provided between the first buried layer 7 and the third buried layer 9b. This makes it possible to restrain the p-type dopant such as Zn contained in the first buried layer 7 from being diffused into the third buried layer 9. This allows the current-light output characteristic to be further improved.

Though not shown, it is also possible to adopt a structure in which a diffraction grating made of n-type semiconductor such as n-type InGaAsP is provided between the active layer 4 and second clad layer 5 in FIG. 11. Such a structure can obtain effects similar to those in Second Embodiment in addition to the above described effect.

Fifth Embodiment

A buried type semiconductor laser according to this Fifth Embodiment will be explained. Here, explanations will be focused on differences from First Embodiment.

Figure 12:
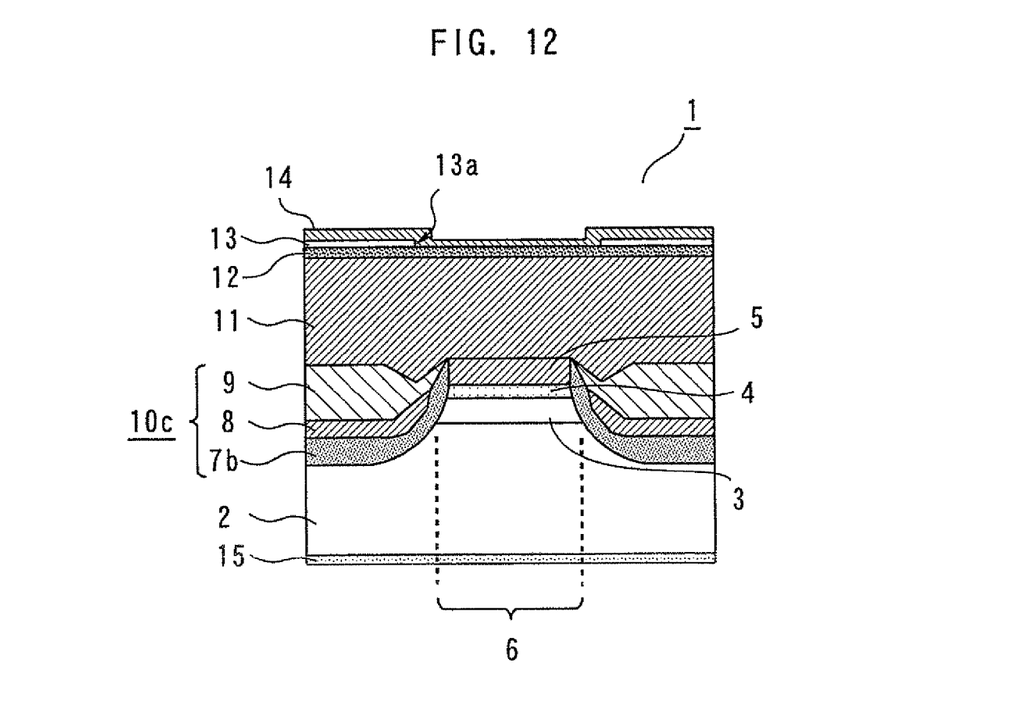
FIG. 12 shows a cross-sectional structure of a buried type semiconductor laser according to Fifth Embodiment of the present invention.

FIG. 12 is a sectional view of the semiconductor laser according to this Fifth Embodiment. As shown in FIG. 12, p-type Al(Ga)InAs (carrier concentration $p=1\times10^{18}$ cm$^{-3}$, Ga composition: 0.07 or less), that is, p-type AlGaInAs or AlInAs is used as a first buried layer 7b. Other aspects are the same as those in First Embodiment.

In the structure shown in First Embodiment (FIG. 1), when electrons overflow from the active layer 4 and overpass the first clad layer 3 at a high temperature, a leakage current which flows into the second buried layer 8 is generated. On the other hand, in this Fifth Embodiment, p-type Al(Ga)InAs is used as the first buried layer. Since this layer has greater band gap energy than the InP layer, even when electrons overflow from the active layer 4 at a high temperature, electrons cannot overpass the first buried layer 7b. Therefore, the leakage current can be restrained and the current-light output characteristic at a high temperature can be improved compared with First Embodiment.

Though not shown, it is also possible to adopt a structure in which a diffraction grating made of n-type semiconductor such as n-type InGaAsP is provided between the active layer 4 and second clad layer 5 in FIG. 12. Such a structure can obtain effects similar to those of Second Embodiment in addition to the above described effect.

Sixth Embodiment

A buried type semiconductor laser according to this Sixth Embodiment will be explained. Here, explanations will be focused on differences from First Embodiment.

Figure 13:
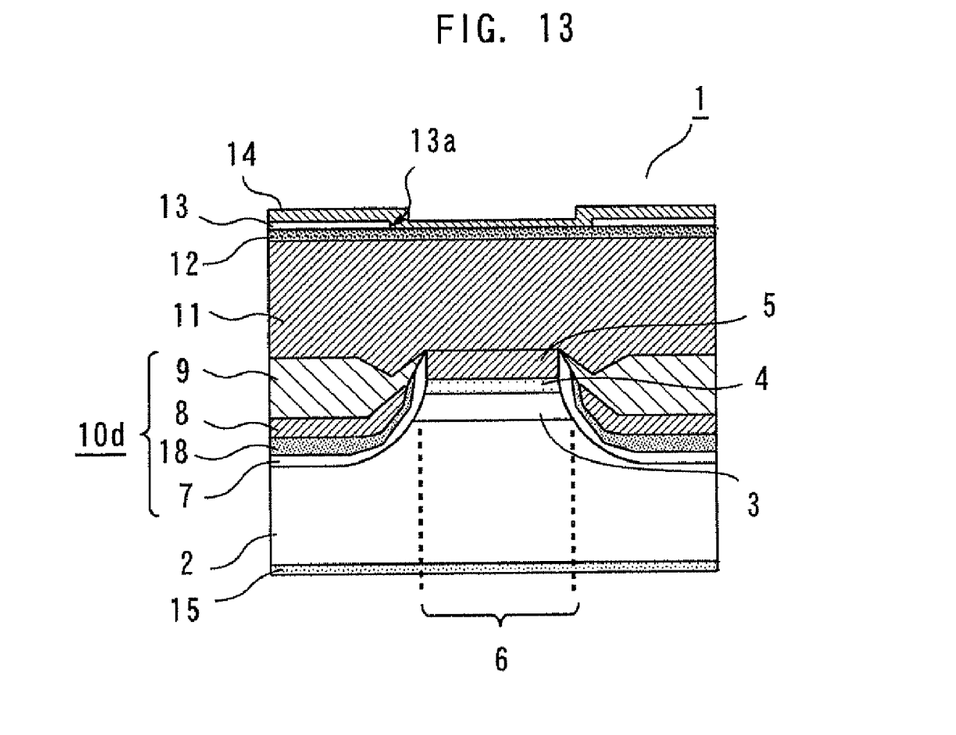
FIG. 13 shows a cross-sectional structure of a buried type semiconductor laser according to Sixth Embodiment of the present invention.

As shown in FIG. 13, p-type InP (carrier concentration $p=1\times10^{18}$ cm$^{-3}$) is used as a first buried layer 7. p-type Al(Ga)InAs (carrier concentration $p=1\times10^{18}$ cm$^{-3}$, Ga composition:

0.07 or below), that is, p-type AlGaInAs or AlInAs is inserted between the first buried layer 7 and second buried layer 8 as a fourth buried layer 18. An end of the fourth buried layer 18 is covered with the end of the first buried layer 7 and the end of the third buried layer 9. Other aspects are the same as those in the structure shown with First Embodiment.

Here, the band gap energy of Al(Ga) InAs is greater than the band gap energy of the InP layer. That is, in the structure shown in FIG. 13, the band gap energy of the fourth buried layer 18 is greater than the band gap energy of the first buried layer 7. Therefore, even if electrons overflow from the active layer 4 at a high temperature, electrons cannot overpass the fourth buried layer 18. This allows the occurrence of a leakage current to be suppressed and allows the current-light output characteristic at a high temperature to be improved.

Though not shown, it is also possible to adopt a structure in which a diffraction grating made of n-type semiconductor such as n-type InGaAsP is provided between the active layer 4 and second clad layer 5 in FIG. 13. Such a structure can produce effects similar to those in Second Embodiment in addition to the above described effect.

Next, the method of manufacturing the buried type semiconductor laser shown in FIG. 13 will be explained. Here, explanations will be focused on differences from the manufacturing method in First Embodiment using the drawings used in First Embodiment.

First, in the same way as First Embodiment, a p-type InP layer 3a, AlGaInAs layer 4a and n-type InP layer 5a are formed on a substrate 2 (see FIG. 2). After that, steps up to a step of forming a ridge section 6 made up of a first clad layer 3, an active layer 4 and a second clad layer 5 on the substrate 2 (see FIG. 4) are carried out in the same way as First Embodiment.

Next, a p-type InP layer is formed on both sides of the ridge section 6 shown in FIG. 4 as a first buried layer 7 using an MOCVD method. Next, a p-type Al(Ga)InAs layer (carrier concentration $P=1\times10^{18}$ $cm^{-3}$, Ga composition: 0.07 or less) is formed as a fourth buried layer 18 on a side and top face of the first buried layer 7. Next, an n-type InP layer is formed as a second buried layer 8 on a side and top face of the fourth buried layer 18. Next, a semi-insulating Fe-doped InP layer is formed as a third buried layer 9 on a side and top face of the second buried layer 8. As a result, an buried current block layer 10d made up of the first buried layer 7, fourth buried layer 18, second buried layer 8 and third buried layer 9 laminated together is formed as shown in FIG. 14.

Figure 14:
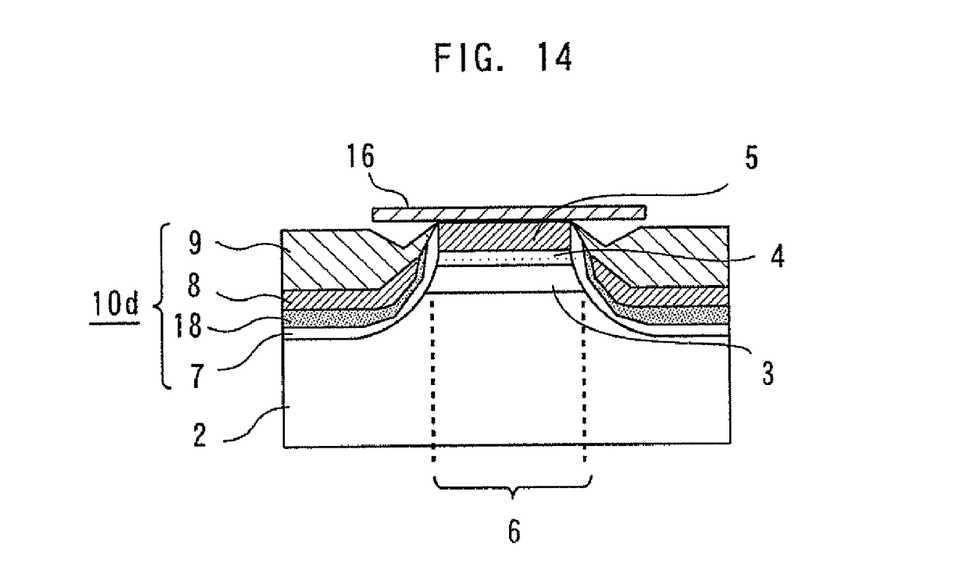
FIGS. 14-16 are sectional views for explaining a method of manufacturing a buried type semiconductor laser according to Sixth Embodiment of the present invention.

Here, as shown in FIG. 14, the fourth buried layer 18 is formed in such a way that the top end of the fourth buried layer 18 is buried between the top end of the first buried layer 7 and the top end of the third buried layer 9. That is, it is formed so that the top end of the p-type Al(Ga)InAs layer is not exposed. This can improve crystallinity of the semiconductor layer when the semiconductor layer is formed on the third buried layer 9 and on the second clad layer 5 in later processes.

Figure 15:
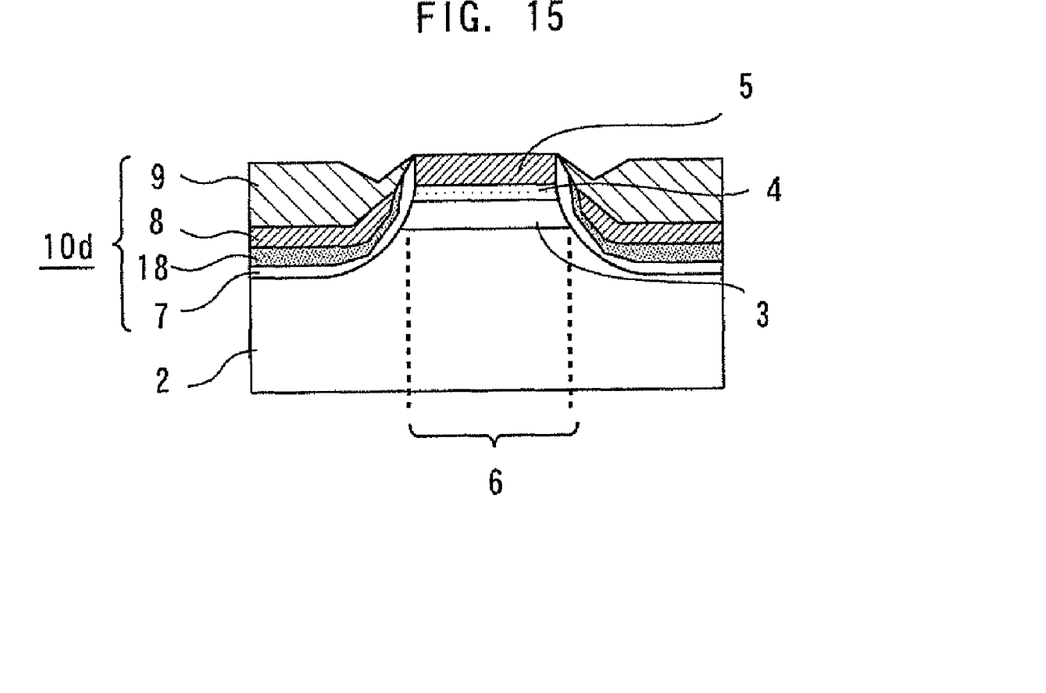
Figure 16:
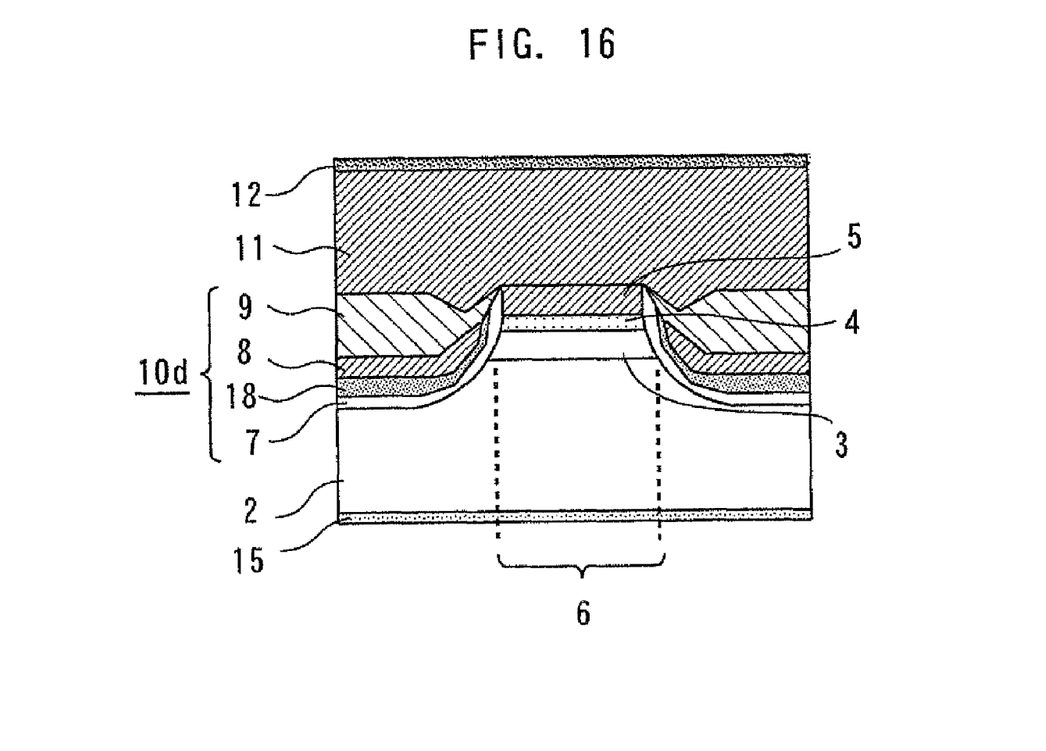

Next, the shape shown in FIG. 15 is obtained by etching and removing an $SiO_2$ film pattern 16 shown in FIG. 14. Next, as in the case of First Embodiment, a semiconductor layer 11 and a contact layer 12 are formed on the second clad layer 5 and third buried layer 9 as shown in FIG. 16.

As described above, since the third buried layer 9 is formed in such a way that the end of the fourth buried layer 18, that is, the end of the Al(Ga)InAs layer is not exposed (see FIG. 14), it is possible to improve crystallinity of the semiconductor layer 11 compared to the structure in Fifth Embodiment (see FIG. 12). Therefore, the reliability of the buried type semiconductor laser can be improved compared to the structure in Fifth Embodiment.

After this, in the same way as First Embodiment, an $SiO_2$ film pattern 13 having an opening 13a is formed on the contact layer 12. Furthermore, an n-type electrode 14 which contacts the contact layer 12 through the opening 13a is formed and a p-type electrode 15 is formed on the back of the substrate 2. As a result, the buried type semiconductor laser shown in FIG. 13 can be formed.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-231125, filed on Aug. 28, 2006 including specification, claims, drawings and summary, on which the Convention priority of the present application is based, are incorporated herein by reference in its entirety.

What is claimed is:

1. A semiconductor laser comprising:
a p-type semiconductor substrate;
a first cladding layer of a p-type semiconductor, located on the semiconductor substrate;
an active layer located on the first cladding layer for generating laser light;
a second cladding layer of an n-type semiconductor and located on the active layer;
a ridge section including the first cladding layer, the active layer, and the second cladding layer;
a buried current blocking layer structure consisting of first, second, third, and fourth burying layers, wherein
the first burying layer is p-type InP and contacts a side of the ridge section,
the second burying layer is an n-type semiconductor,
the third burying layer is a semi-insulating layer containing one of Fe and Ru and contacts a side and top face of the second burying layer,
the fourth burying layer is located between and contacts the first burying layer and the second burying layer, is one of AlGaInAs and AlInAs, has a larger band gap energy than the band gap energy of InP, and contacts a side of the first burying layer,
the third burying layer contacts a side of the fourth burying layer, and
an end of the fourth burying layer is covered by an end of the first burying layer and an end of the third burying layer; and
an n-type semiconductor layer which covers a top face of the second cladding layer and a top face of the third burying layer.

2. The semiconductor laser according to claim 1, including a diffraction grating which reflects laser light of a specific wavelength and is located between the active layer and the second cladding layer.

3. The semiconductor laser according to claim 2, wherein the diffraction grating includes an n-type semiconductor.

4. The semiconductor laser according to claim 1, wherein the first burying layer contains Fe.

* * * * *